United States Patent
Lin et al.

(10) Patent No.: US 11,596,973 B2
(45) Date of Patent: *Mar. 7, 2023

(54) DOUBLE-SHAFT SHIELDING DEVICE AND THIN-FILM-DEPOSITION EQUIPMENT WITH THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/497,489

(22) Filed: Oct. 8, 2021

(65) Prior Publication Data
US 2022/0410202 A1    Dec. 29, 2022

(30) Foreign Application Priority Data

Jun. 29, 2021 (TW) ................................ 110123819

(51) Int. Cl.
*B05C 21/00*   (2006.01)
*B05D 1/32*    (2006.01)

(52) U.S. Cl.
CPC ............ *B05C 21/005* (2013.01); *B05D 1/322* (2013.01)

(58) Field of Classification Search
None
See application file for complete search history.

(56) References Cited

U.S. PATENT DOCUMENTS

| 6,511,585 B1 * | 1/2003 | Shi | H01J 37/32055 |
| | | | 118/723 VE |
| 6,669,829 B2 * | 12/2003 | Feltsman | C23C 14/566 |
| | | | 118/712 |
| 6,827,825 B2 * | 12/2004 | Feltsman | C23C 14/566 |
| | | | 73/863.81 |
| 7,008,517 B2 * | 3/2006 | Feltsman | C23C 14/566 |
| | | | 204/192.1 |
| 7,014,738 B2 * | 3/2006 | Shi | H01J 37/32055 |
| | | | 204/298.41 |
| 10,851,453 B2 * | 12/2020 | Tsai | C23C 14/52 |

(Continued)

*Primary Examiner* — Jethro M. Pence
(74) *Attorney, Agent, or Firm* — Chun-Ming Shih; HDLS IPR Services

(57) ABSTRACT

The present disclosure provides a thin-film-deposition equipment with double-shaft shielding device, which includes a reaction chamber, a carrier and a double-shaft shielding device. The double-shaft shielding device includes a first-connecting arm, a second-connecting arm, a first-shield member, a second-shield member, a first driver and a second driver. The first driver is connected to the first-shield member via the first-connecting arm, and the second driver is connected to the second-shield member via the second-connecting arm, for respectively driving and swinging the two shield members to move in opposite directions via the two connecting arms. Thereby, during a cleaning process of the thin-film-deposition equipment, the two drivers swing the two shield members toward each other into a shielding state for covering the carrier, such that to effectively prevent removed pollutants from polluting the carrier during.

10 Claims, 10 Drawing Sheets

(56) References Cited

U.S. PATENT DOCUMENTS

| | | | |
|---|---|---|---|
| 11,251,028 B2* | 2/2022 | Tsai | H01L 21/67028 |
| 2003/0155234 A1* | 8/2003 | Feltsman | C23C 14/566 |
| | | | 118/712 |
| 2004/0182698 A1* | 9/2004 | Feltsman | C23C 14/566 |
| | | | 204/298.11 |
| 2019/0242007 A1* | 8/2019 | Rotte | C23C 14/22 |
| 2020/0051796 A1* | 2/2020 | Shinada | H01L 21/68785 |
| 2021/0118653 A1* | 4/2021 | Shinada | H01J 37/32715 |

* cited by examiner

DOUBLE-SHAFT SHIELDING DEVICE AND THIN-FILM-DEPOSITION EQUIPMENT WITH THE SAME

TECHNICAL FIELD

The present disclosure relates to a double-shaft shielding device and a thin-film-deposition equipment with the same, which mainly employ shield members to cover a substrate carrier, in order to prevent polluting the carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier (hereafter as carrier), thus there is a need to keep out the substrate carrier from the removed pollutant. The present disclosure provides a double-shaft shielding device and a thin-film-deposition equipment with the same, which mainly employs a driver to rotate and swing two shield members in opposite angular directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

An object of the present disclosure is to provide a thin-film-deposition equipment with double-shaft shielding device, which includes a reaction chamber, a carrier and a double-shaft shielding device. The double-shaft shielding device includes two drivers and two shield members, wherein the two drivers respectively interconnect and swing the two shield members to move in opposite angular directions, such that to operate the shield members between an open state and a shielding state.

During a process of cleaning the reaction chamber, the driver swings the two shield members to approach each other, such that the two shield members come together to cover the carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

Moreover, the two shield members may be configured to overlap when operating into the shielding state, such that to fully cover and shield the carrier from the pollutants. However, the two overlapped shield members do not contact each other during the process, thereby to avoid collision or friction therebetween and creating some wear-off particles which may fall to pollute the carrier as well.

An object of the present disclosure is to provide a thin-film-deposition equipment with double-shaft shielding device, which employs two shield members that can combine to form a whole shield, thereby to improve space efficiency. In one embodiment, the two shield members sway in opposite angular directions within the containing space of the reaction chamber, wherein the two are operable between an open state and a shielding state within the reaction chamber, such that to improve space efficiency of the reaction chamber.

To achieve the abovementioned object, the present disclosure provides a thin-film-deposition equipment, which includes a reaction chamber that has a carrier within the containing space for carrying at least one substrate; and a double-shaft shielding device. The double-shaft shielding device comprising: a first-shield member that is disposed within the containing space; a first driver that is connected to the first-shield member; and a second driver that is connected to the second-shield member, wherein the first driver and the second driver drive and swing the first-shield member and the second-shield member to move in opposite directions between an open state and a shielding state, wherein in the shielding state, the first-shield member and the second-shield member approach each other to cover the carrier.

The present disclosure also provides a double-shaft shielding device, which is adapted to thin-film-deposition equipment, and includes: a first-shield member; a second-shield member; and a driver that interconnects and drives the first-shield member and the second-shield member to respectively sway and move the first-shield member and the second-shield member in opposite directions between an open state and a shielding state, wherein in the shielding state, the first-shield member and the second-shield member approach each other; and in the open state, the first-shield member and the second-shield member have an open space therebetween.

Another object of the present disclosure is to provide the abovementioned shielding device and thin-film-deposition equipment, wherein each of the two shield members has a surface facing each other and respectively disposed with a cavity and a protrusion. The drivers drive and swing the two shield members to approach each other, wherein the protrusion on one of the shield member is inserted into the cavity on another one of the shield member, such that the two shield members form a whole shield.

To achieve the abovementioned object, the present disclosure provides the aforementioned shielding device, wherein: the first-shield member includes a first-inner-edge surface formed with at least one protrusion; the second-shield member includes a second-inner-edge surface formed with at least one cavity corresponding to the protrusion of the first-inner-edge surface.

Another object of the present disclosure is to provide the abovementioned shielding device and thin-film-deposition equipment, wherein the shielding device further includes two guard plates, for guarding the shield members from damage caused by high-temperature matters or the heat itself.

To achieve the abovementioned object, the present disclosure provides the aforementioned shielding device, which includes a first-guard plate disposed on a surface of the first-shield member; and a second-guard plate disposed a surface of the second-shield member, wherein the first-guard plate and the second-guard plate also can approach each other to cover the first-shield member and the second-shield member together.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
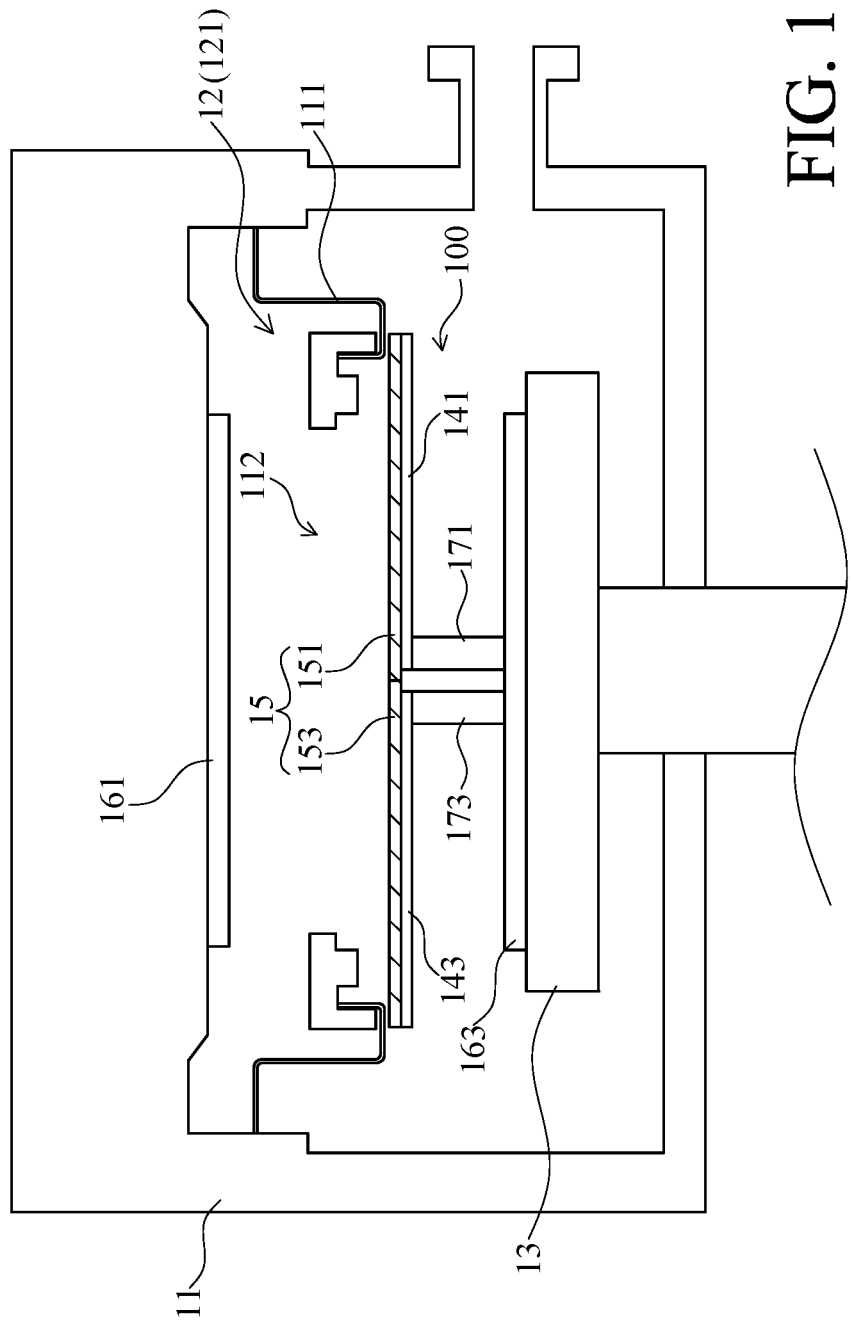
FIG. 1 is a schematic sectional view illustrating a double-shaft shielding device of a thin-film-deposition equipment which is operated in a shielding state, according to one embodiment of the present disclosure.

Referring to FIG. 1, which is a schematic sectional view illustrating a double-shaft shielding device 100 of a thin-film-deposition equipment 10 which is operated in a shielding state, according to one embodiment of the present disclosure. As shown in the FIG, the thin-film-deposition equipment 10 main includes a reaction chamber 11, a carrier 13 and a double-shaft shielding device 100 (hereafter as "shielding device"), wherein the reaction chamber 11 includes a containing space 12 for containing the carrier 13 and a portion of the shielding device 100.

The carrier 13 is positioned within the containing space 12 of the reaction chamber 11, for carrying at least one substrate (not shown). In this embodiment, the thin-film-deposition equipment 10 is exemplified as a physical-vapor deposition chamber. The reaction chamber 11 is disposed within a target material 161 and has the target material 161 facing the carrier 13. Specifically, the target material 161 may be disposed on a ceiling surface of the reaction chamber 11 to face the carrier 13 and/or the substrate carried thereon within the containing space 12, for example.

Figure 2:
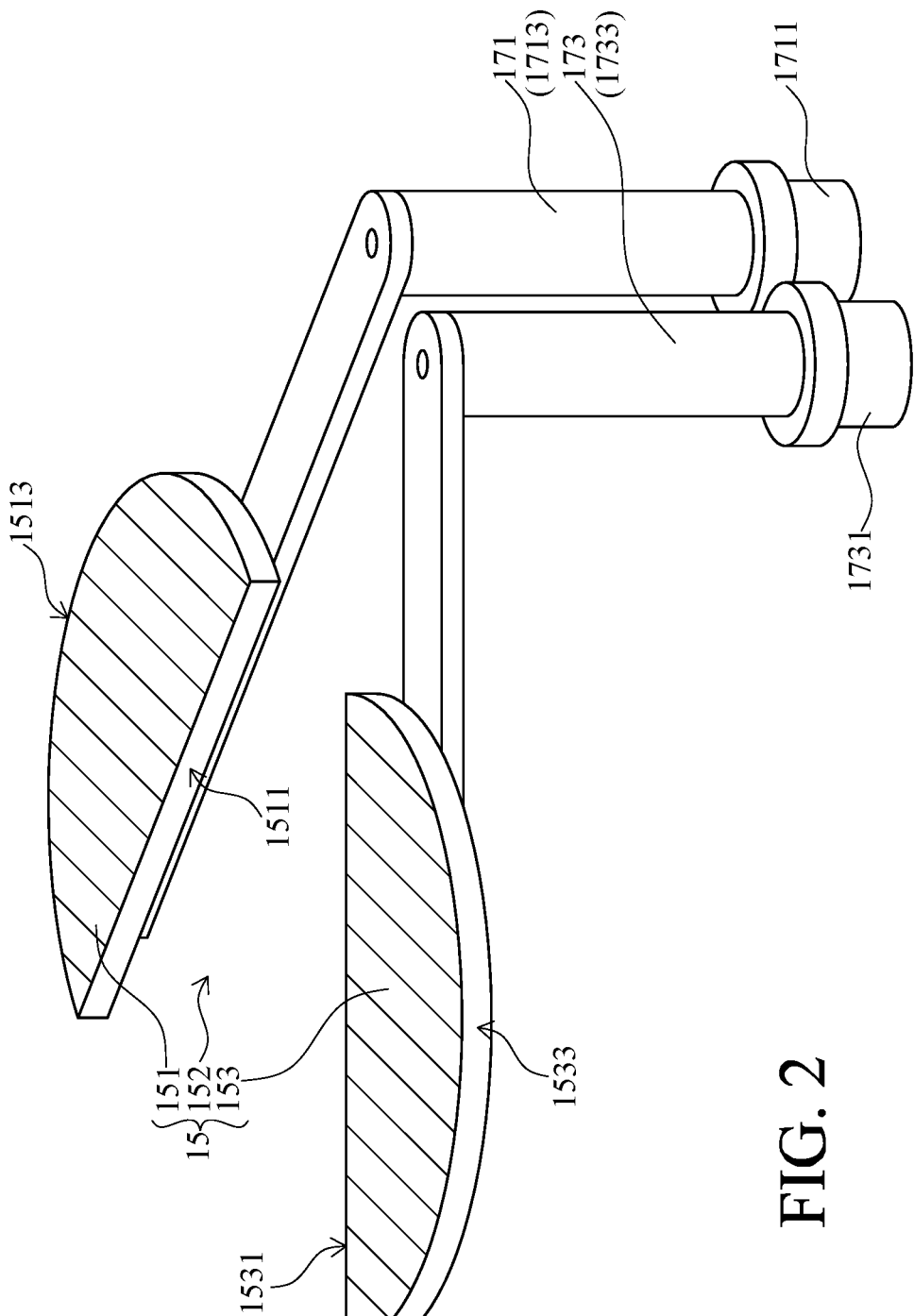
FIG. 2 is a schematic perspective view illustrating the shielding device which is operated in an open state, according to one embodiment of the present disclosure.
Figure 3:
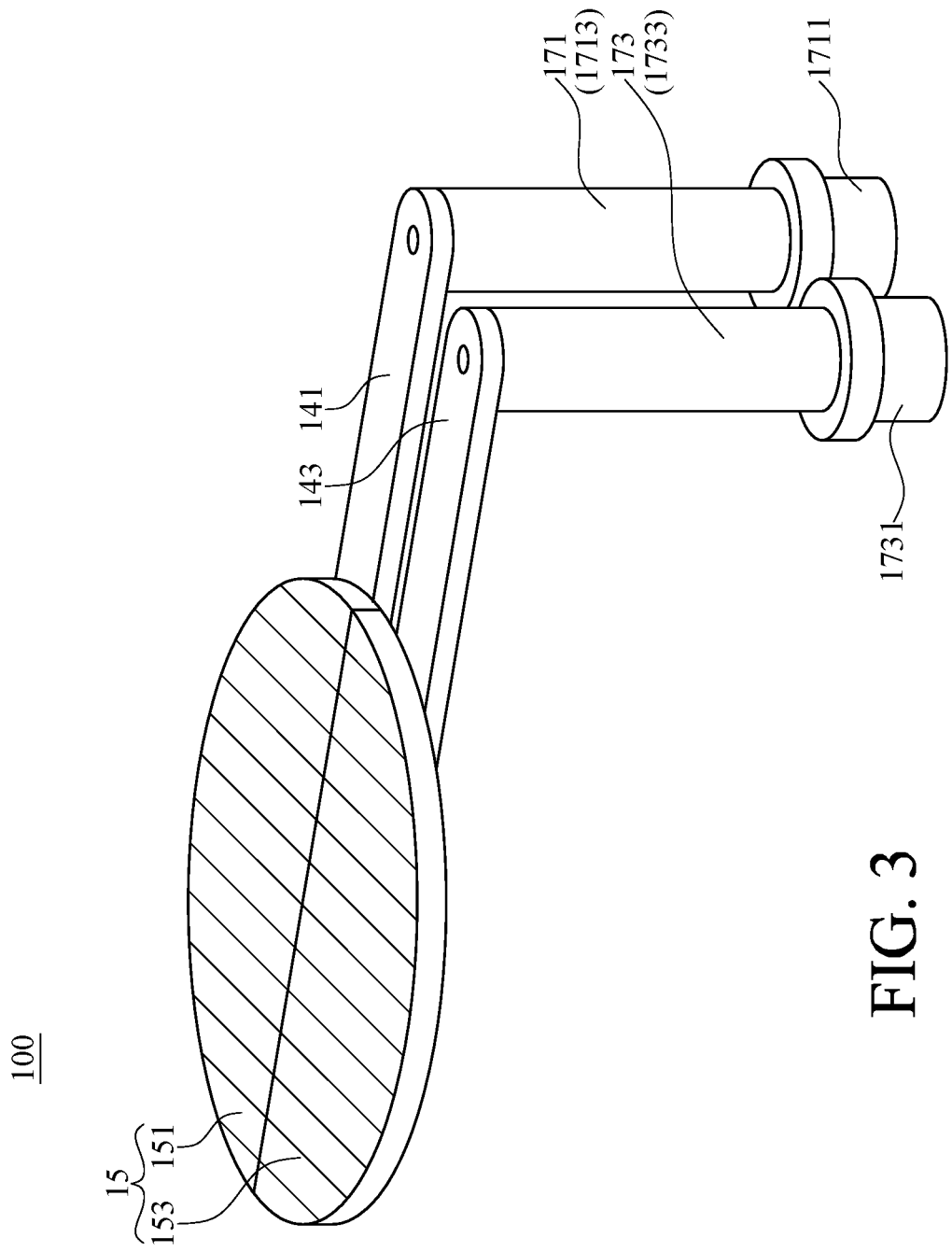
FIG. 3 is a schematic perspective view illustrating the shielding device which is operated in the shielding state, according to one embodiment of the present disclosure.

Referring to FIG. 2 and FIG. 3, the shielding device 100 includes a first-shield member 151, a second-shield member 153, a first driver 171, and a second driver 173. The two shield members 151, 153 are disposed within the containing space 12, whereas the two drivers 171, 173 are partially disposed within the containing space 12 to respectively connect the two shield members 151, 153.

Specifically, the first driver 171 is power-transmittably connected to the first-shield member 151 via the first-connecting arm 141, in the other hand, the and second driver 173 is power-transmittably connected to the second-shield member 153 via the second-connecting arm 143. With such structure, the two drivers 171, 173 respectively drive, swing the two shield members 151, 153 in opposite angular directions, via the two connecting arms 141, 143, such as to have the first-shield member 151 and the second-shield member 153 swaying toward or away from each other synchronously, and respectively about an axle of the first driver 171 and an axle of the second driver 173. However, the present disclosure is not limited to such structure, in other embodiment, the shielding device 100 may be configured to have the drivers 171, 173 directly connected to the two shield members 151, 153 without the connecting arms 141, 143.

The first-shield member 151 and the second-shield member 153 may be formed as plates with similar shapes and area sizes, such as respectively formed as one half and another half of a round plate. Such that, as the two drivers 171, 173 respectively swing the first-connecting arm 141 and the second-connecting arm 143 to respectively move the first-shield member 151 and the second-shield member 153 toward each other, the two members 151, 153 come together and form a whole round shield 15, for covering and shielding the carrier 13 and/or the substrate thereon.

In more detail as shown in FIG. 2, the first-shield member 151 has a first-inner-edge surface 1511 and at least one first-outer-edge surface 1513, in the other hand, the second-shield member 153 has a second-inner-edge surface 1531 and at least one second-outer-edge surface 1533. With such appearance, when the shielding device 15 is operated into a shielding state, the first-inner-edge surface 1511 of the first-shield member 151 and the second-inner-edge surface 1531 of the second-shield member 153 are adjacent to each other, and also face each other.

However, the two shield members 151, 153 formed with similar shapes and area sizes are merely one embodiment of the present disclosure, in other embodiment, each of the shield member 151, 153 may be formed in different shape (e.g. rectangular, elliptical or other geometric shape), it is only sufficient for the two shield members 151, 153 to approach each other for covering the carrier and/or the substrate thereon.

To be specific, the thin-film-deposition equipment 10 and/or the shielding device 100 according to the present disclosure, which can be operated to switch between two states, as an open state and the shielding state. The shielding state is described above, with a reference to FIG. 3. In the other side, as shown in FIG. 2, the two drivers 171, 173 can respectively drive, swing the first-shield member 151 and the second-shield member 153 to leave each other and move into the open state. Moreover, in the open state, the first-shield member 151 and the second-shield member 153 have an open space 152 therebetween, such that the first-shield member 151 and the second-shield member 153 do not get between the target material 161 and the carrier 13 with the substrate 163 thereon.

In one embodiment of the present disclosure as shown in FIG. 2 and FIG. 3, the first driver 171 includes at least one motor 1711 and a shaft seal 1713, the second driver 173 also includes at least one motor 1731 and a shaft seal 1733. Each of the motor 1711, 1731 is power-transmittably connected to the corresponding connecting arm 141, 143 and shield member 151, 153 via the shaft seals 1713, 1733, for driving the corresponding shaft seals 1713, 1733 to rotate, and hence to respectively swing the connecting arms 141, 143 and move the shield members 151, 153 in the opposite directions. In more detail, the motors 1711, 1731 are mounted on the reaction chamber 11, and positioned outside of the containing space 12. The shaft seals 1713, 1733 extends from the motors 1711, 1731 and into the reaction chamber 11, and hence partially disposed within the containing space 12.

Specifically, each the shaft seals 1713, 1733 may be a common shaft seal component, which is mainly for isolating the containing space 12 of the reaction chamber 11 from external environment thereof and maintaining a vacuum condition within the containing space 12. Also, in a different embodiment of the present disclosure, each of the shaft seals 1713, 1733 may be a magnetic liquid rotary sealing, which includes a plurality of bearings, at least one permanent magnet, at least one pole piece and at least one ferrofluid.

Surely, in other embodiment, the shaft seals 1713, 1733 may be configured to directly connect to the two shield members 151, 153 without the connecting arms 141, 143, the present disclosure is limited to the abovementioned embodiment.

When the first-shield member 151 and the second-shield member 153 are operated into the open state, the carrier 13 can be driven by the elevating unit to approach the target material 161. Thereafter, a process gas (e.g. noble gas) is employed to bombard the target material 161, in order to remove and deposit particles (e.g. atoms or molecules) of the target material 161 and form a thin film on a surface of the substrate carried on the carrier 13.

In a different embodiment of the present disclosure as shown in FIG. 1, the containing space 12 of the reaction chamber 11 may be disposed with a tubular blocking member 111, which has one end connected to the ceiling surface of the reaction chamber 11, and another end formed with an opening 112. Such that, when the carrier 13 approaches the target material 161, the carrier 13 also enters the opening 112 or contacts the blocking 111. The reaction chamber 11, the carrier 13 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 12:
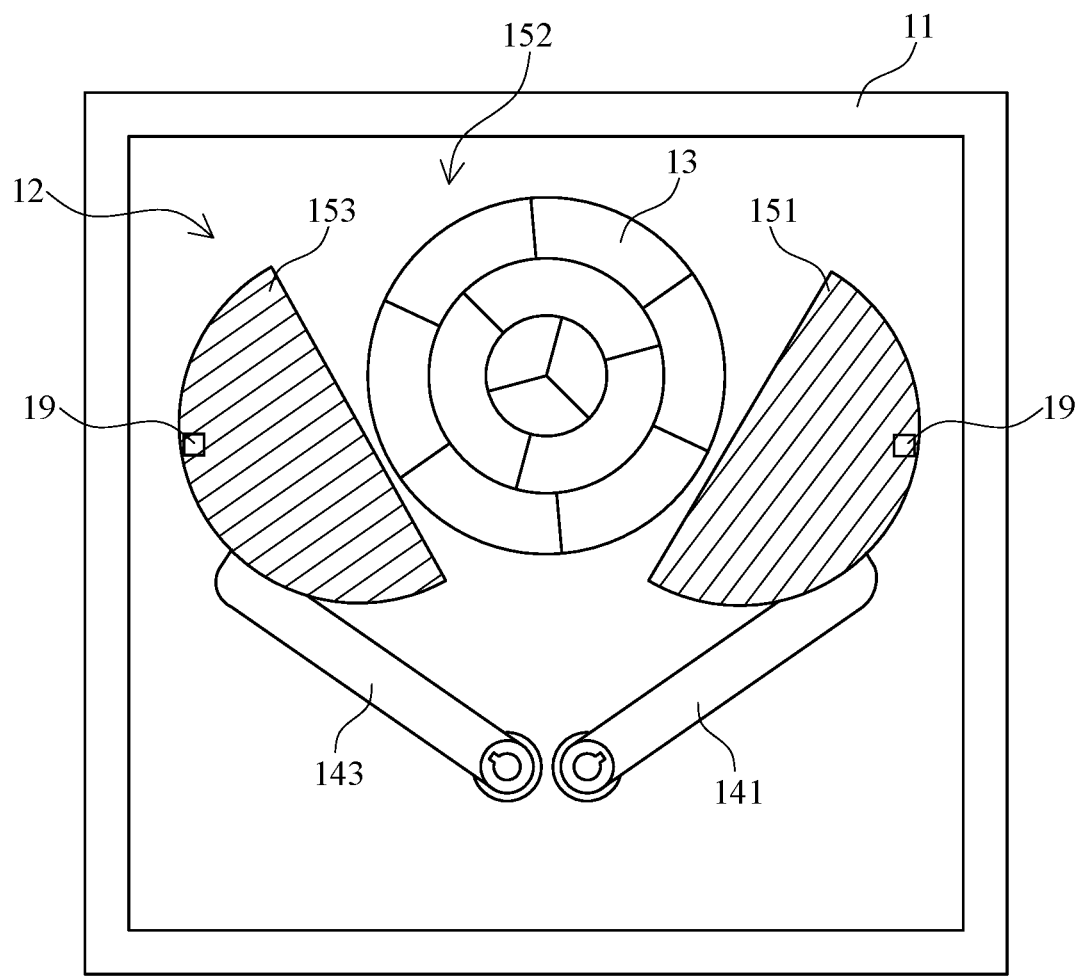
FIG. 12 is a schematic top view illustrating the shielding device of the thin-film-deposition equipment which in the open state, according to one embodiment of the present disclosure.

In the opposite manner, as shown in FIG. 3 and FIG. 12, the drivers 171, 173 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 13, such that to cover and shield the carrier 13 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 11 and/or an inside of the blocking member 111, and to remove oxides, nitrides or other pollutants on the target material 161, also to remove undesired, waste thin film within the reaction chamber 11 and/or the blocking member 111.

Moreover, a manner of the first-shield member 151 and the second-shield member 153 being operated into the shielding state, which is defined as the first-shield member 151 and the second-shield member 153 continue to approach each other, until a distance (gap space) between the inner-edge surfaces 1511, 1531 of the two members 151, 153 is less than a threshold value, such as 1 millimeter (mm). To be specific, the first-shield member 151 and the second-shield member 153 do not actually contact each other, such that to avoid a collision or friction therebetween, which may create some wear-off particles therefrom to pollute the containing space 12 of the reaction chamber 11 and/or the carrier 13 therein.

Also to mention that in this embodiment, the inner-edge surfaces 1511, 1531 of the two members 151, 153 are formed in a straight, flat manner, also parallel to each other. However, the present disclosure is not limited thereto, in other embodiment, the inner-edge surfaces 1511, 1531 may be formed in concave and convex, zig-zag, or even other corresponding geometric shapes, but still maintain the distance (gas space) therebetween less than the threshold value when in the shielding state.

Furthermore, in another different embodiment of the present disclosure, each of the two shield members 151, 153 may be configured to have the inner-edge surface 1511, 1531 formed inclined relative to a top surface (such as upside of FIG. 2) and a bottom surface thereof (such as downside of FIG. 2). With such structure, when the two shield members 151, 153 are operated into the shielding state, the inner-edge surfaces 1511, 1513 face each other and form the gap space therebetween in an inclined manner. Such that, as the pollutants created during the cleaning process fall straightly down, the inclined gas space between the two shield members 151, 153 can effectively prevent the pollutants from straightly passing through and then contacting the carrier 13.

In yet another different embodiment of the present disclosure, the first-shield member 151 and the second-shield member 153 may be positioned in different heights, such as to have the first-shield member 151 positioned higher than the second-shield member 153. Such that, when in the shielding state, the first-shield member 151 partially covers the top surface of the second-shield member 153 and hence overlaps therewith, thereby to improve the coverage for the carrier 13 and/or the substrate thereon.

Figure 4:
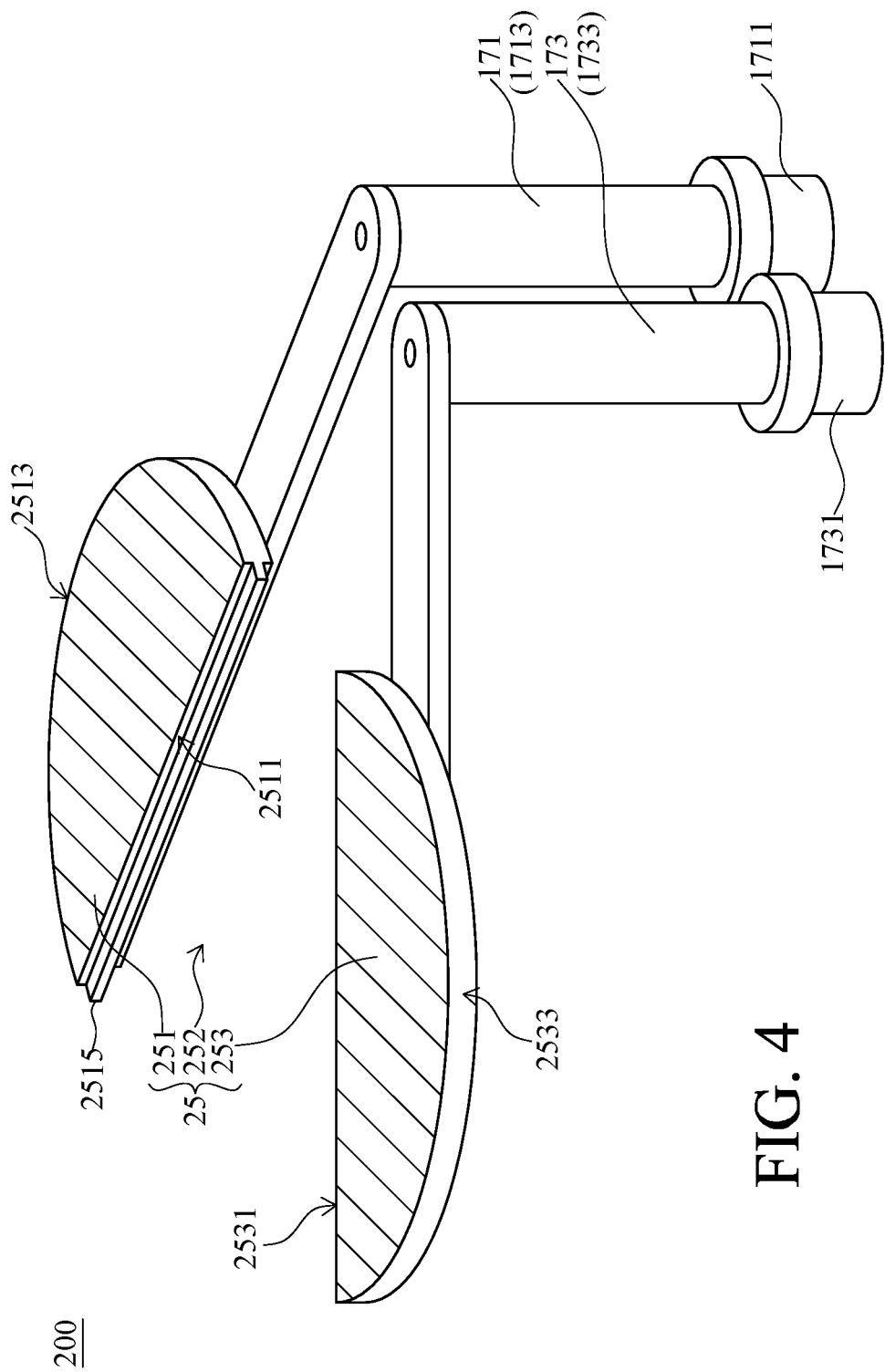
FIG. 4 is a schematic perspective view illustrating the shielding device which is operated in the open state, according to another embodiment of the present disclosure.
Figure 5:
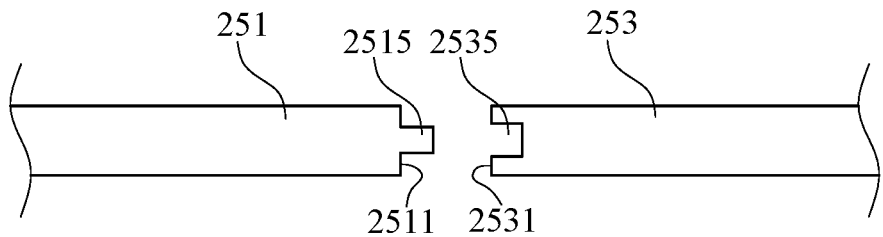
FIG. 5 is a schematic fragmentary sectional view illustrating two shield members of the shielding device which are separate from each other, according to another embodiment of the present disclosure.
Figure 6:
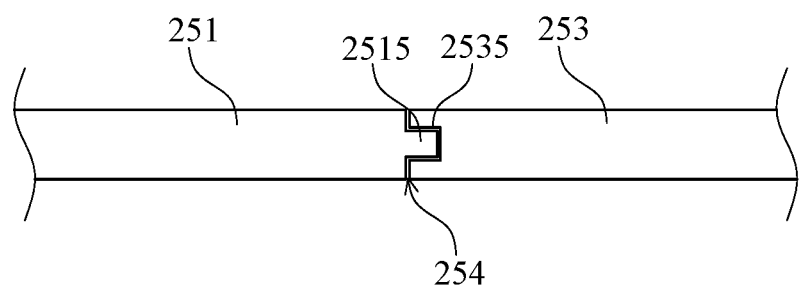
FIG. 6 is a schematic fragmentary sectional view illustrating the two shield members of the shielding device which are operated into the shielding state, according to another embodiment of the present disclosure.

Referring to FIG. 4, which is a schematic perspective view illustrating the shielding device 200 of the thin-film-deposition equipment which is in the open state, according to another embodiment of the present disclosure. The shielding device 200 in this embodiment is similar to that in aforementioned embodiments, but different in structures of the first-shield member 251 and the second-shield member 253. The first-shield member 251 has the first-inner-edge surface 2511 formed with at least one protrusion 2515, in the other hand, the second-shield member 253 has the second-inner-edge surface 2531 formed with at least one cavity 2535. Furthermore, the protrusion 2515 on the first-inner-edge surface 2511 corresponds to the cavity 2535 on the second-inner-edge surface 2531, and the protrusion 2515 is formed slightly smaller than the cavity 2535.

Figure 7:
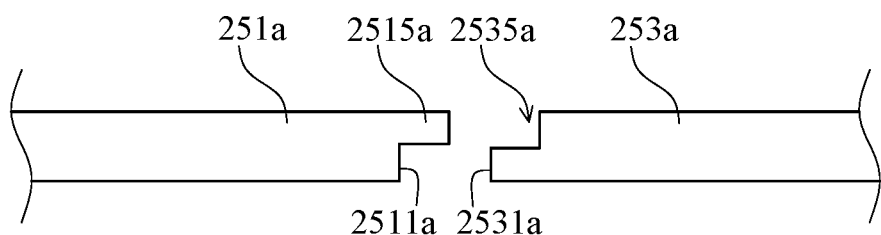
FIG. 7 is a schematic fragmentary sectional view illustrating the two shield members of the shielding device which are operated into the shielding state, according to another different embodiment of the present disclosure.

Also to mention that in this embodiment, the protrusion 2515 is positioned at middle of the first-inner-edge surface 2511 on the first-shield member 251, the cavity 2535 is also positioned at middle of the second-inner-edge surface 2531 on the second-shield member 253. However, in another different embodiment as shown in FIG. 7, the protrusion 2515a may be positioned at an upper portion of the first-inner-edge surface 2511a of the first-shield member 251a, and the cavity 2535a may also be positioned at an upper portion of the second-inner-edge surface 2531a.

Furthermore, in this embodiment, when the first-shield member 251 and the second-shield member 253 are operated in the shielding state, between the first-shield member 251 and the second-shield member 253, the first-inner-edge surface 2511 and the second-inner-edge surface 2531 are adjacent to each other and maintain a gap space 254 therebetween, meanwhile, the protrusion 2515 on the first-inner-edge surface 2511 enters the cavity 2535 on the second-inner-edge surface 2531 but still maintain the gap space 254, and thus no contact therebetween.

Similar to the aforementioned embodiment, the gap space 254 between the first-inner-edge surface 2511 and the second-inner-edge surface 2531 is configured less than the aforementioned threshold value, such as 1 mm. Thereby, the first-shield member 251 and the second-shield member 253 do not contact each other, nor the protrusion 2515 and the cavity 2535 thereon, in order prevent the collision or friction therebetween.

Also, similar to the aforementioned embodiment, the first-shield member 251 and the second-shield member 253 are formed as half-round plates, with straight and flat inner-edge surfaces 2511, 2531. However, the present disclosure is mot limited thereto, in other embodiment, the inner-edge surfaces may be formed in concave and convex shapes or zig-zag shapes, or even inclined planes but still corresponding to each other.

Figure 8:
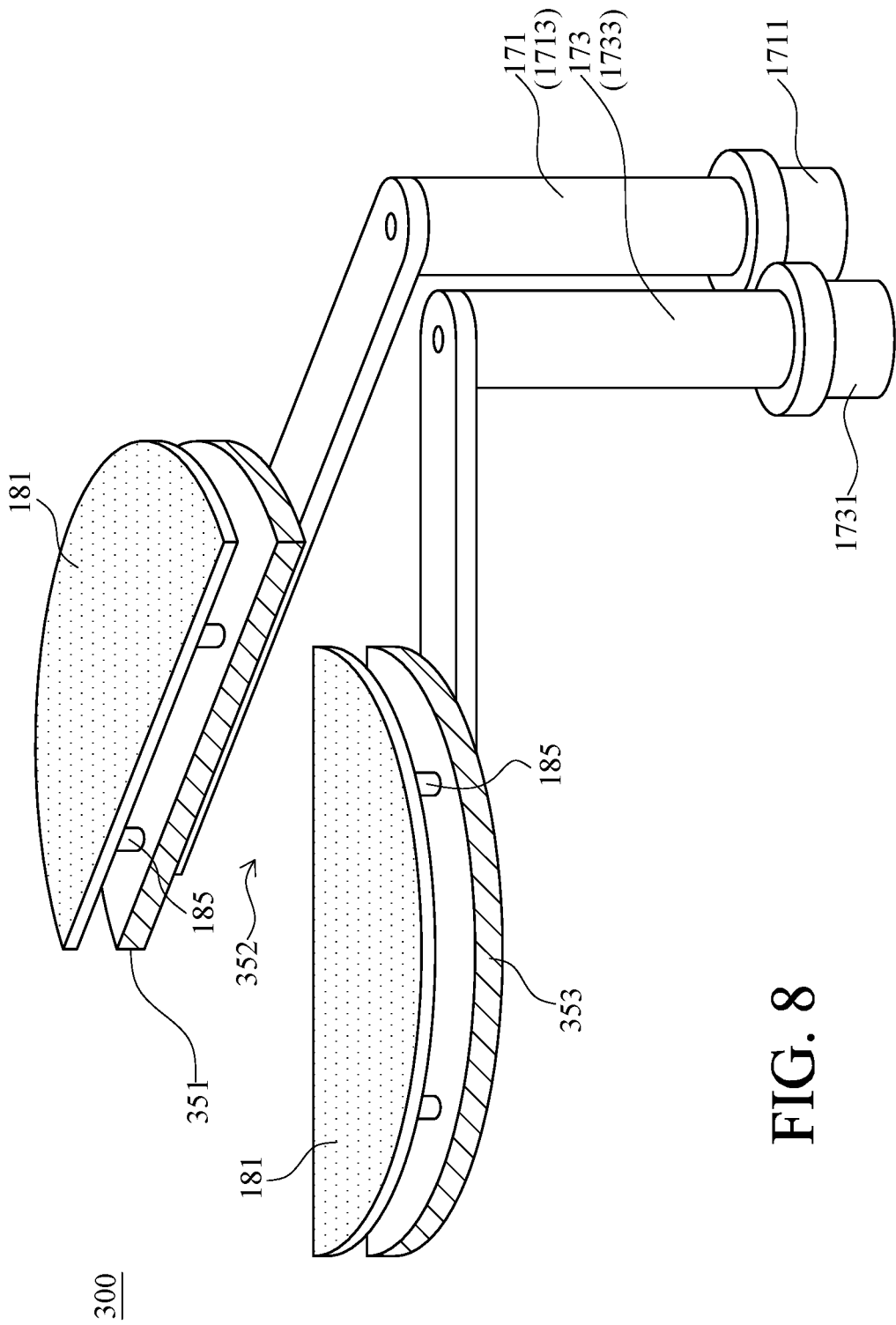
FIG. 8 is a schematic perspective view illustrating the shielding device which is operated in the open state, according to one more embodiment of the present disclosure.
Figure 9:
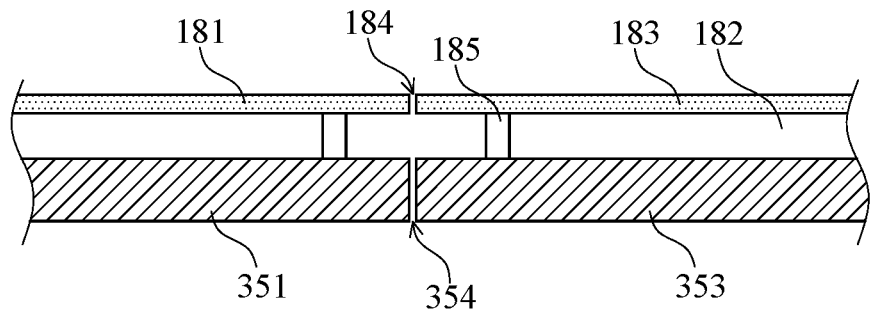
FIG. 9 is a schematic fragmentary sectional view illustrating two guard plates and two shield members of the shielding device which are in the shielding state, according to one more embodiment of the present disclosure.

Referring to FIG. 8 and FIG. 9, wherein FIG. 8 is a schematic perspective view illustrating the shielding device of the thin-film-deposition equipment which is in the open state, and FIG. 9 is a schematic fragmentary sectional view illustrating the first-shield member and the second-shield member of the shielding device which are in the shielding state, according to yet another embodiment of the present disclosure. In comparison with the aforementioned embodiments, the shielding device 300 in this embodiment, which includes a first-guard plate 181 and a second-guard plate 183 respectively disposed on the top surfaces of the first-shield member 351 and the second-shield member 353. With such structure, as the two drivers 171, 173 drive, swing the connecting arms 141, 143 to move the second-shield members 351, 353 toward each other into the shielding state, the first-guard plate 181 and the second-guard plate 183 also come together to get between the shield members 351, 353 and the target material 161, to provide further coverage and protection for the shield members 351, 353.

The guard plates 181, 183 mainly serve to block the high-temperature matters or the heat created during the process of cleaning the reaction chamber 11 and the target material 161, from directly contacting the shield members 351, 353, such that to prevent thermal deformation and malicious effect occurring thereto.

Figure 13:
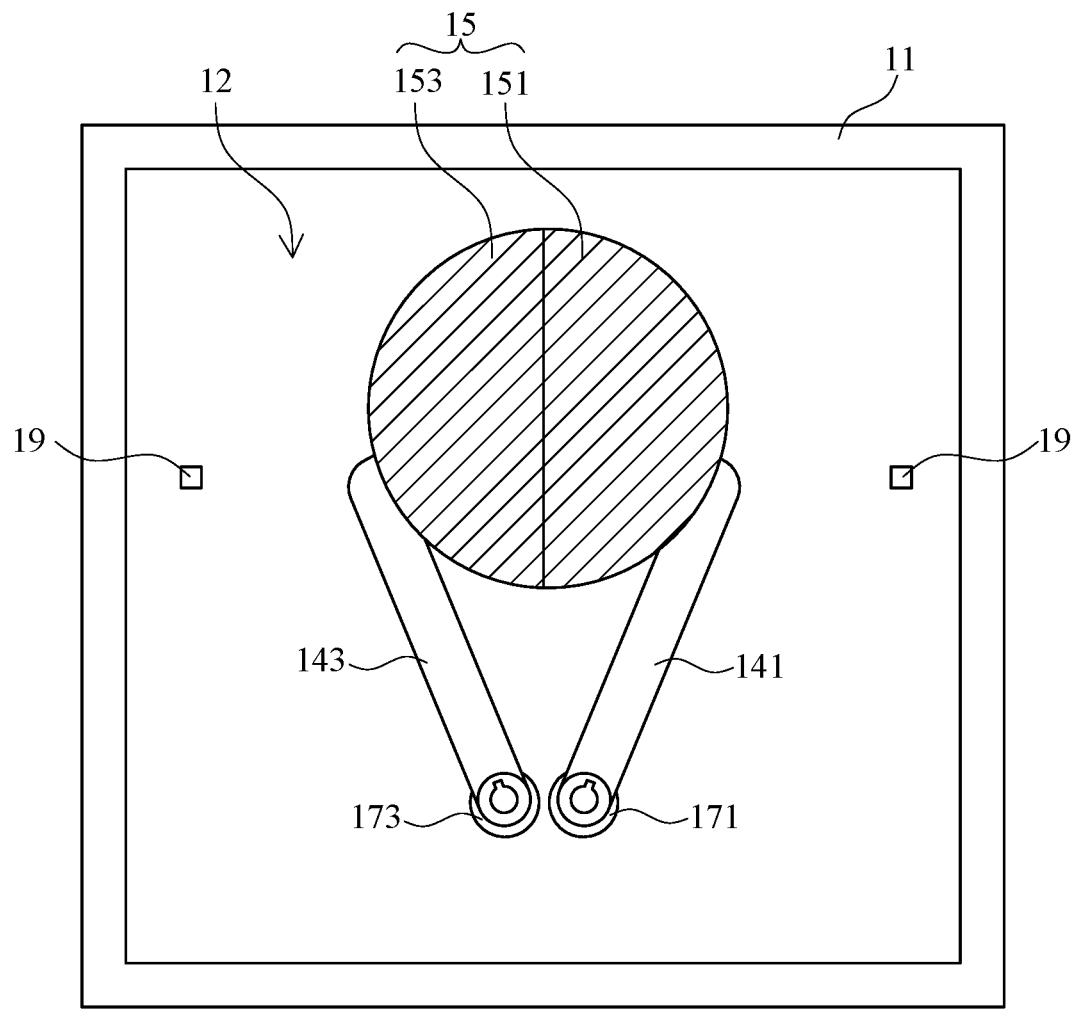
FIG. 13 is a schematic top view illustrating the shielding device of the thin-film-deposition equipment which is in the shielding state, according to one embodiment of the present disclosure.
Figure 14:
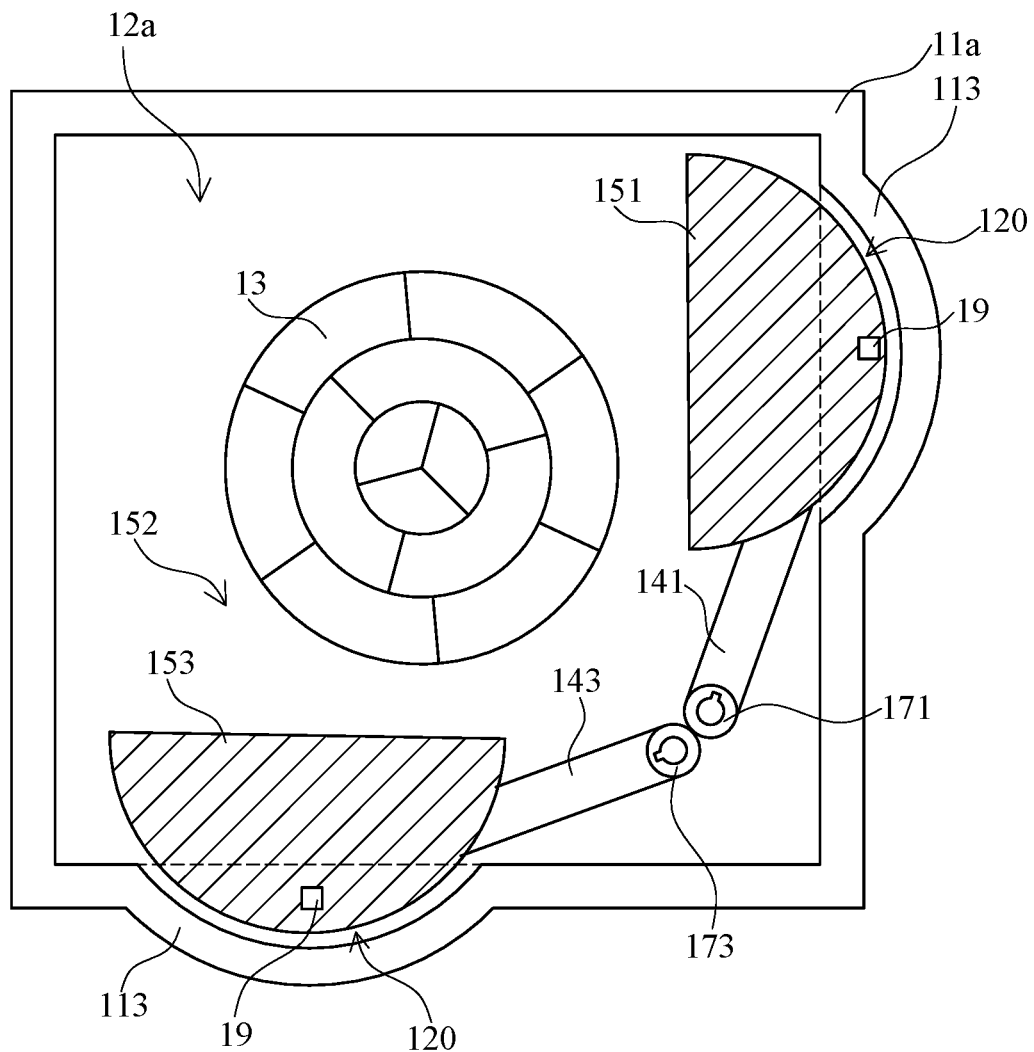
FIG. 14 is a schematic top view illustrating the shielding device of the thin-film-deposition equipment which in is the open state, according to one different embodiment of the present disclosure.

Also to mention that, when the shield members 351, 353 are in the shielding state, the guard plates 181, 183 do not contact each other neither, in order to avoid a collision or friction therebetween from creating wear-off particles and hence to pollute the containing space 12 and/or the carrier 13 within the reaction chamber 11. Such that, as shown in FIG. 13 and FIG. 14, when the shield members 351, 353 are in the shielding state, the shield members 351, 353 maintain a first gap space 354 (similar to the gap space 254 in aforementioned embodiment) therebetween, the guard plates 381, 383 also maintain a second gap space 384 therebetween, wherein first gap space 354 and second the gap space 384 have some spatial overlap, in this embodiment. Moreover, the first-shield member 351 and the first-guard plate 381 both may be formed with similar half-round shapes and area sizes, and so do the second-shield member 353 and the second-guard plate 383.

In one embodiment of the present disclosure, the guard plates 181, 183 are connected to the shield members 351, 353 via a plurality of support units 185, and thereby a gap 182 is respectively formed between the first-guard plate 181 and the first-shield member 351, and between the second-guard plate 183 and the second-shield member 353. The gaps 182 can serve prevent the high temperature generated during the cleaning process from directly transferring from the guard plates 181, 183 into the shield members 351, 353, such that to further prevent the thermal deformation of the shield members 351, 353.

Figure 10:
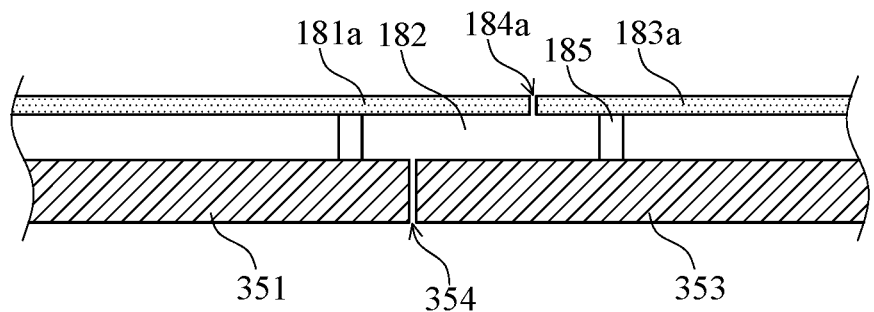
FIG. 10 is a schematic fragmentary sectional view illustrating the two guard plates and two shield members of the shielding device which are in the shielding state, according to one more embodiment of the present disclosure.

In yet another embodiment of the present disclosure, as shown in FIG. 10, the guard plates 381a, 383a and the shield members 351, 353 may be configured to have the first gap space 354a and the second gap space 184a not spatially overlap each other. In this embodiment, the two shield members 351, 353 have substantially identical area sizes, whereas the two guard plates 181a, 183a have different area sizes, such as the first-guard plate 381a may be formed larger than the second-guard plate 383a. However surely, in practical use, it may also be configured into an opposite manner, such as the two shield members 351, 353 have different area sizes, whereas the two guard plates 181a, 183a have substantially identical area sizes, which makes no spatial overlap between the first gap space 354a and the second gap space 184a vice versa.

When the first gap space 354 has no spatial overlap with the second gap space 184, the high-temperature matters and the heat of the cleaning process is prevented from directly passing through the second gap space 184 then the first gap space 354, and then to reach the carrier 13, thereby to improve the coverage for the carrier 13 and/or the substrate.

Figure 11:
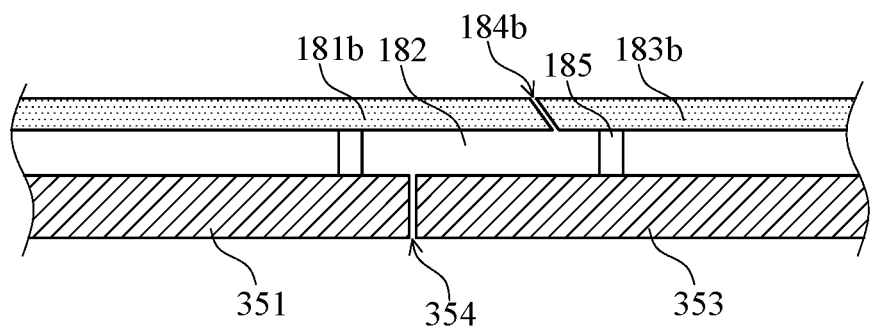
FIG. 11 is a schematic fragmentary sectional view illustrating the two guard plates and two shield members of the shielding device which are in the shielding state, according to one more different embodiment of the present disclosure.

As shown in FIG. 11, in another different embodiment of the present disclosure, similar to the two shield members 351, 353, each of the two guard plates 181b, 183b has an inner-edge surface formed inclined relative to a top surface and a bottom surface thereof, wherein the inner-edge surfaces of the two guard plates 181b, 183b are also substantially parallel to each other. With such structure, when the two shield members 351, 353 are operated into the shielding state, the inner-edge surfaces of the two guard plates 181b, 183b face each other and form the second gap space 184b in an inclined manner relative to the first gap space 354 between the two shield members 351, 353, such that to tilt away from the second gap space 184b for preventing the pollutant from passing through and entering the first gap space 354, in a more effective manner. Surely, in other different embodiment, the two shield members 351, 353 may also be configured to have the inner-edge surfaces thereof formed in the inclined, substantially parallel manner, such that to tilt, orient both the first gap space and the second gap space, for a further effective performance against the falling pollutants.

In one embodiment of the present disclosure similar to the aforementioned one, along with the first-shield member 351 and the second-shield member 353 that are positioned in different heights, the first-guard plate 181 and the second-guard plate 183 can also be disposed in different heights, such as to have the first-shield member 351 positioned higher than the second-shield member 353, with the first-guard plate 181 also positioned higher than the second-guard plate 183. Such that, when in the shielding state, the first-shield member 351 partially covers top of the second-shield member 353 and hence overlaps therewith, the first-guard plate 181 also partially covers a top of the second-guard plate 183 and overlaps therewith, thereby to improve the coverage for the carrier 13 and/or the substrate.

Surely, along with the shield members 351, 353 that may be formed in different shapes, the guard plates 181, 183 may also be formed in any geometric shapes. Moreover, the first-shield member 351 and the second-shield member 353 may also be formed with the protrusion 2515 and the cavity 2535 in the embodiment of FIG. 4~FIG. 7, and combined with the guard plates 181, 183 for an even more effective coverage performance.

In one embodiment of the present disclosure as shown in FIG. 12 and FIG. 13, the reaction chamber 11 and/or the containing space 12 may be configured to have a relatively large size, which is sufficient for accommodating the two shield members 151, 153 of the shielding device 100 (also including the shielding device 200, 300 in other embodiments) in the open state, therefore no need of additional containers for storing the shield members 151, 153.

In one embodiment of the present disclosure, the reaction chamber 11 may be further disposed with a plurality of position sensors 19 (e.g. optical sensors) within the containing space 12, for respectively detecting locations the first-shield member 151 and the second-shield member 153 (including the guard plates 181, 181a, 181b, 183, 183a, 183b in other embodiments as well). The position sensors 19 are configured to confirm that the first-shield member 151 and the second-shield member 153 are in the open state, thereby to avoid undesired interference, collisions between those movable components as the two connecting arms 141, 143 and the two shield members 151, 152 and the carrier 13.

In practical use, according to how the other components, mechanisms and movements thereof in the thin-film-deposition equipment 10 are arranged, the shielding device 100 may be disposed at different locations within the reaction chamber 11. For this embodiment as shown in FIG. 12 and FIG. 13, as the containing space 12 of the reaction chamber 11 is substantially formed with a rectangular cross-section, the drivers 171, 173 of the shielding device 100 may be disposed at a side of the reaction chamber 11 and/or the containing space 12. Alternatively, in other embodiments (similar to an embodiment of FIG. 14), the drivers 171, 173 of the shielding device 100 may be both disposed on or near by a corner of the reaction chamber 11 and/or the containing space 12, such that the reaction chamber 11 can be further disposed with substrate passages or gas-extraction pipelines (not shown) at lateral sides thereof.

In the embodiment as shown in FIG. 14, the reaction chamber 11a may be respectively disposed with two sensor areas 113 which are respectively connected to and which protrude from two sides of the reaction chamber 11a, wherein each of the sensor areas 113 has a height shorter than that of the reaction chamber 11a. Furthermore, each of the sensor areas 113 is formed with a sensing space 120 therein which is spatially and fluidly connected to the containing space 12 of the reaction chamber 11a, for partially containing the first-shield member 151 and the second-shield member 153 (including the guard plates 181, 181a, 181b, 183, 183a, 183b in other embodiments as well) respectively when the two shield members 151 are operated into the open state. Also to mention that when in the open state, each of the first-shield member 151 and the second-shield member 153 has a relatively small portion within the corresponding sensing space 120, and relatively large portion remaining within the containing space 12.

Moreover, each of the sensing spaces 120 of the sensor areas 113 are disposed with at least one position sensor 19, for respectively detecting and confirming that the two shield members 151, 153 have entered the sensing spaces 120 and in the open state. Also to mention that in this embodiment, the drivers 171, 173 are both disposed on or near by a corner of the reaction chamber 11 and/or the containing space 12, and the two sensor areas 113 are respectively disposed on two adjacent sides of the reaction chamber 11, to facilitate disposing substrate passages or gas-extraction pipelines on the reaction chamber 11. However surely, in other different embodiment, the driver can be configured to dispose on a side of the reaction chamber 11 and/or the containing space 12, and the two sensor areas can be respectively disposed on two opposite sides of the reaction chamber 11.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
   a reaction chamber comprising a containing space;
   a carrier disposed within the containing space for carrying at least one substrate thereon;
   a shielding device comprising:
      a first-shield member that is disposed within the containing space;
      a second-shield member that is disposed within the containing space;
      a first driver connected to the first-shield member; and
      a second driver connected to the second-shield member, wherein the first driver and the second driver respectively drive and swing the first-shield member and the second-shield member to move in opposite directions between an open state and a shielding state, wherein in the shielding state, the first-shield member and the second-shield member approach each other for covering the carrier; and
   two sensor areas connected to and protruding from the reaction chamber, wherein each of the sensor areas is formed with a height shorter than that of the reaction chamber; each of the sensor areas has a sensing space fluidly connected to the containing space of the reaction chamber for respectively and partially containing the first-shield member and the second-shield member in the open state; and each of the sensor areas is disposed with at least one position sensor for detecting the first-shield member and the second-shield member within the sensing spaces of the sensor areas.

2. The thin-film-deposition equipment according to claim 1, wherein each of the first driver and the second driver comprises a shaft seal and at least one motor; the first driver has the at least one motor thereof connected to the first-shield member via the shaft seal thereof; and the second driver has the at least one motor thereof connected to the second-shield member via the shaft seal thereof.

3. The thin-film-deposition equipment according to claim 1, further comprising a first-connecting arm and a second-connecting arm, wherein the first driver is connected to the first-shield member via the first-connecting arm, and the second driver is connected to the second-shield member via the second-connecting arm.

4. The thin-film-deposition equipment according to claim 1, further comprising a plurality of position sensors that are disposed on the reaction chamber, for detecting locations of the first-shield member and the second-shield member.

5. The thin-film-deposition equipment according to claim 1, wherein the first-shield member has a top surface, a bottom surface, and a first-inner-edge surface formed in an inclined manner relative to the top surface or the bottom surface; the second-shield member has a top surface, a bottom surface, and a second-inner-edge surface formed in an inclined manner relative to the top surface or the bottom surface thereof; and the first-inner-edge surface and the second-inner-edge surface are parallel to each other.

6. A thin-film-deposition equipment, comprising:
   a reaction chamber comprising a containing space;
   a carrier disposed within the containing space for carrying at least one substrate thereon; and
   a shielding device comprising:
      a first-shield member that is disposed within the containing space;
      a second-shield member that is disposed within the containing space;
      a first driver connected to the first-shield member;
      a second driver connected to the second-shield member, wherein the first driver and the second driver respectively drive and swing the first-shield member and the second-shield member to move in opposite directions between an open state and a shielding state, wherein in the shielding state, the first-shield member and the second-shield member approach each other for covering the carrier;
      a first-guard plate disposed on the first-shield member; and
      a second-guard plate disposed on the second-shield member, wherein in the shielding state, the first-shield member and the second-shield member approach each other for covering the carrier, therewith the first-guard plate and the second-guard plate also approach each other for covering the first-shield member and the second-shield member.

7. The thin-film-deposition equipment according to claim 6, wherein in the shielding state, the first-shield member and the second-shield member have a first gap space therebetween; the first-guard plate and the second-guard plate have a second gap space therebetween; and the first gap space and the second gap space do not spatially overlap.

8. The thin-film-deposition equipment according to claim 7, wherein in the shielding state, the first-guard plate and the second-guard plate form the second gap space in an inclined manner relative to the first gap space.

9. The thin-film-deposition equipment according to claim 6, wherein the shielding device has the first-guard plate formed with an area size larger than that of the second-guard plate.

10. A thin-film-deposition equipment, comprising:
    a reaction chamber comprising a containing space;
    a carrier disposed within the containing space for carrying at least one substrate thereon; and
    a shielding device comprising:
       a first-shield member that is disposed within the containing space;
       a second-shield member that is disposed within the containing space;
       a first driver connected to the first-shield member; and
       a second driver connected to the second-shield member, wherein the first driver and the second driver respectively drive and swing the first-shield member and the second-shield member to move in opposite directions between an open state and a shielding state, wherein in the shielding state, the first-shield member and the second-shield member approach each other for covering the carrier, wherein the first-shield member of the shielding device comprises a first-inner-edge surface formed with at least one protrusion; the second-shield member of the shielding device comprises a second-inner-edge surface formed with at least one cavity; and in the shielding state, the at least one protrusion on the first-inner-edge surface of the first-shield member enters the at least one cavity on the second-inner-edge surface of the second-shield member.

\* \* \* \* \*